(12) United States Patent
Yu

(10) Patent No.: US 7,679,971 B1
(45) Date of Patent: Mar. 16, 2010

(54) DUAL PORT PLD EMBEDDED MEMORY BLOCK TO SUPPORT READ-BEFORE-WRITE IN ONE CLOCK CYCLE

(75) Inventor: Haiming Yu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/357,892

(22) Filed: Jan. 22, 2009

Related U.S. Application Data

(62) Division of application No. 11/683,072, filed on Mar. 7, 2007, now Pat. No. 7,499,365, which is a division of application No. 11/076,319, filed on Mar. 8, 2005, now Pat. No. 7,206,251.

(51) Int. Cl.
  *G11C 7/10* (2006.01)
(52) U.S. Cl. .............. 365/189.04; 365/154; 365/230.05
(58) Field of Classification Search ............ 365/189.04, 365/154, 230.05
  See application file for complete search history.

(56) References Cited

U.S. PATENT DOCUMENTS

| | | | | |
|---|---|---|---|---|
| 6,104,663 A * | 8/2000 | Kablanian | .............. | 365/230.05 |
| 6,665,209 B2 * | 12/2003 | Osada et al. | ................ | 365/154 |
| 6,915,400 B2 * | 7/2005 | Engelahardt | ................ | 711/167 |
| 6,967,861 B2 * | 11/2005 | Braceras et al. | ............. | 365/154 |

* cited by examiner

*Primary Examiner*—Hoai V Ho
*Assistant Examiner*—Kretelia Graham
(74) *Attorney, Agent, or Firm*—Martine Penilla & Gencarella, LLP

(57) ABSTRACT

A method for a read-before-write functionality for a memory within a programmable logic device (PLD) is provided. The method begins when a read operation and a write operation are initiated through two different ports of a memory simultaneously to access the same address in the memory. In order to prevent the write operation from proceeding prior to the read operation, a read-before-write control logic is provided to the control block of the port that supports the write operation. Thus, the write operation is paused until the control block of the port that supports the write operation receives a signal from a read sense amplifier indicating that the read operation is complete. The read sense amplifier is capable of detecting the completion of a read operation by monitoring the voltage difference of the read bitline. When this voltage difference reaches a threshold value, the read sense amplifier triggers a write wordline signal. The enabling of the write wordline signal causes, the data to be written to the memory.

8 Claims, 7 Drawing Sheets

DUAL PORT PLD EMBEDDED MEMORY BLOCK TO SUPPORT READ-BEFORE-WRITE IN ONE CLOCK CYCLE

CROSS REFERENCE TO RELATED APPLICATION

This application is a divisional application of U.S. patent application Ser. No. 11/683,072 filed on Mar. 7, 2007 now U.S. Pat. No. 7,499,365 and entitled, "DUAL PORT PLD EMBEDDED MEMORY BLOCK TO SUPPORT READ-BEFORE-WRITE IN ONE CLOCK CYCLE", which is a divisional application of U.S. patent application Ser. No. 11/076,319 filed on Mar. 8, 2005 U.S. Pat. No. 7,206,251 and entitled, "DUAL PORT PLD EMBEDDED MEMORY BLOCK TO SUPPORT READ-BEFORE-WRITE IN ONE CLOCK CYCLE." The disclosure of these related applications are incorporated herein by reference for all purposes.

BACKGROUND

The present invention relates generally to programmable logic devices (PLDs). More particularly, the invention relates to a PLD having embedded random access memory.

Programmable logic devices (PLDs) generally include an array of uncommitted elements that can be interconnected in a general way. PLDs provide storage, logic, and wires in a standard package that can be programmed by the user according to the specification of the user to make an application specific integrated circuit (ASIC). When first introduced, PLDs had simple designs and were costly. Therefore, they were primarily used in prototypes and emulation systems. Currently, PLDs are relatively inexpensive and include all the features needed to implement highly complex hardware designs. As a result, they are used in preproduction applications as well as in marketed products.

It has become common to provide on-board random access memory (RAM) as part of the PLDs. When RAM is provided on a PLD, it may be configurable as logic elements, or it may be used to satisfy other memory requirements of the user's logic configuration. The RAM may be of a single-port or a dual-port. In case of a single-port RAM, the read and write operations are conducted through a single port, whereas, in case of a dual-port RAM, the read and write operations are conducted through separate ports thereby allowing simultaneous read and write operations.

However, a problem arises with the dual port memory when both the read and write ports access the same address simultaneously. If the write operation reaches the address prior to the read operation, then the data in the address would be over-written, which may result in data loss. One of the known approaches to ensure that the read operation occurs prior to the write operation includes, adding a delay to the write address enable signal. The delay ensures that there is enough timing separation between the read-port turn on and the write-port turn on. In order to ensure that the time margin between the read-port turn on and the write-port turn on is large enough to cover all the process corners, PLD designers assume a worst case and incorporate a number of delay elements to handle the worst case. These delay elements occupy valuable real estate space on the PLD. Additionally, the implementation of the delay elements restricts the minimum cycle time needed to support a "read-before-write" operation from the different ports since the worst case is always assumed. Moreover, there is additional work involved for the test engineers and production engineers to estimate the number of delay elements required and then evaluate whether the estimated delay elements are sufficient to cause the read operation to occur before the write operation.

Accordingly, there exists a need for a system and a method for a PLD with an embedded memory that provides read-before-write without the drawbacks described above.

SUMMARY

Broadly speaking, the present invention fills these needs by providing a circuit and method for starting a write operation immediately after the read operation. The embodiments of the present invention detect the end of a read operation and generate a signal that is sent to the control block of the port that controls the write operation indicating that the read operation is complete. Thereafter, the write operation may begin. The signal indicating the completion of the read operation may be generated through alternative methods as discussed below. The present invention may be implemented in numerous ways, including a device and a method for forming a device. Several embodiments of the present invention are described below.

In one aspect of the invention, a method for a read-before-write functionality for a memory within a programmable logic device (PLD) is provided. The method begins when a read operation and a write operation are initiated through two different ports of a memory simultaneously to access the same address in the memory. In order to prevent the write operation from proceeding prior to the read operation, a read-before-write control logic is provided to the control block of the port that supports the write operation. Thus, the write operation is paused until the control block of the port that supports the write operation receives a signal from a read sense amplifier indicating that the read operation is complete. The read sense amplifier is capable of detecting the completion of a read operation by monitoring the voltage difference of the read bitline within the memory. When this voltage difference reaches a threshold value, the read sense amplifier triggers a control signal that triggers a write wordline signal. The write wordline signal causes, the data to be written to the memory.

In another aspect of the invention, a method for a read-before-write functionality for a dual port memory within a programmable logic device (PLD) is provided. The method begins when a read operation and a write operation are initiated through two different ports of a dual port memory within a PLD to access the same memory address. In order to facilitate read-before-write, the read wordline signal is monitored since the second edge of the read wordline signal indicates completion of the read operation. When the second edge of the read wordline signal is detected, a control signal is generated and this generated control signal activates a write wordline signal. In one embodiment, the second edge is the falling edge of the read wordline signal. The activation of the write wordline signal causes the write operation to proceed and the data are written into the memory of the PLD.

In yet another aspect of the invention, an integrated circuit (IC) for enabling a read-before-write functionality for a memory within a PLD is provided. The integrated circuit includes a memory having two ports. One of the ports enables a read operation from the memory, while the second port enables a write operation into the memory. The IC circuit is further provided with a sense amplifier module. The sense amplifier module monitors the voltage difference in the bit-line of the memory and when the sense amplifier detects that this voltage difference has reached a particular threshold level, the sense amplifier module activates a write wordline signal. The write wordline signal causes the write operation to proceed and the data are written into the memory subsequent to the read operation being completed. The write operation and the read operation may be completed within a single clock cycle. In one embodiment, the threshold level that triggers the write wordline signal is about 20% of an initial voltage of the bitline.

In another aspect of the invention, an integrated circuit (IC) for enabling a read-before-write functionality for a memory within a PLD is provided. The memory includes a first port and a second port for a read and write operation, respectively. The first port includes a control block capable of detecting the completion of a read operation. The control block detects completion of the read operation by monitoring the second edge of the read operation. When the control block detects that a read operation is complete, e.g., at the falling edge of the read operation, the control block activates a control signal. The control signal in turn activates the write wordline signal, which begins the write operation. The write wordline signal triggers the data to be written into the memory of the PLD. Thus, the read and write operations may take place within a single clock cycle.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention for beginning a write operation immediately after a read operation so that both operations are completed within a single clock cycle, is provided. The embodiments of the present invention monitor the read operation and signal the write operation to start immediately upon completion of the read operation. Consequently, the write operation is triggered based upon the actual completion of the read operation. Therefore, each read and write operation may be adaptively handled on an individual basis rather than a worst case scenario.

Figure 1:
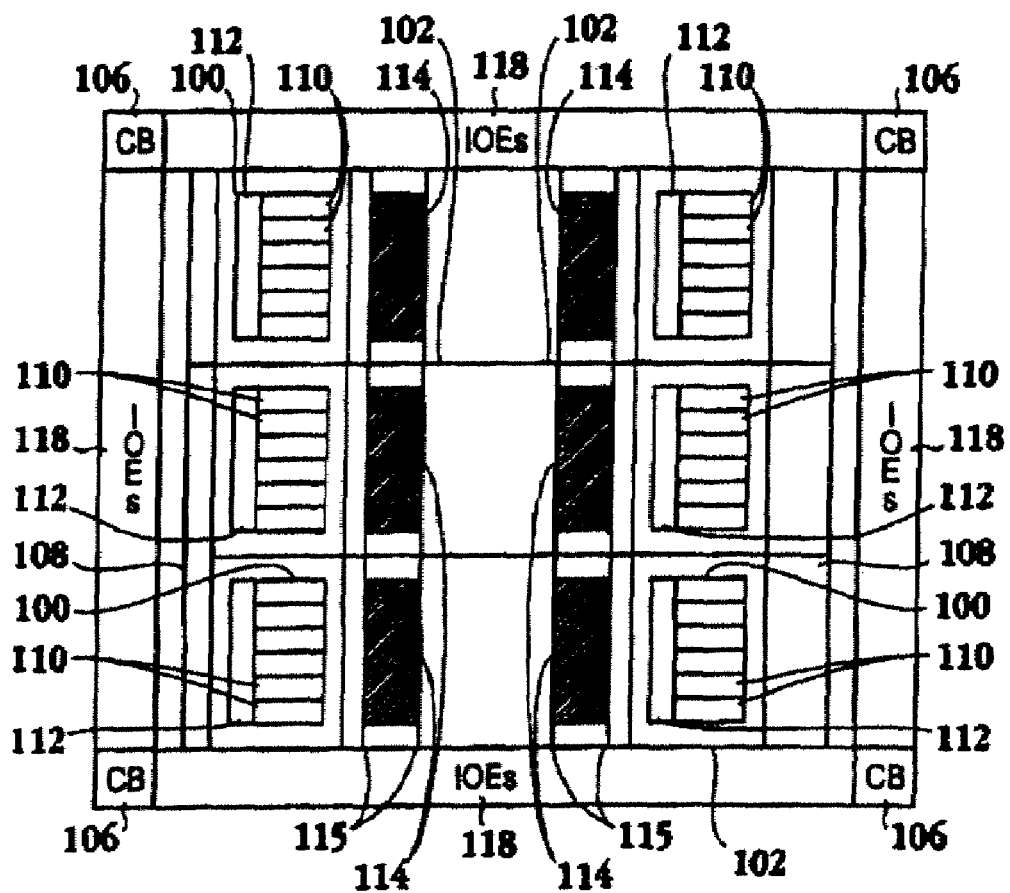
FIG. 1 is a high-level diagram of a PLD including embedded dual-port random access memory in accordance with an embodiment of the present invention.

FIG. 1 is a high-level diagram of a field programmable gate array (FPGA) including embedded dual-port random access memory in accordance with an embodiment of the invention. The FPGA is used to illustrate the basic structure and functionality of a PLD. One skilled in the art will understand and appreciate that other available types of PLDs, as listed below, may be used in place of FPGAs. The layout of the FPGA includes input/output circuitry blocks (IOEs) 118. FIG. 1 further includes logical array blocks 100. Logical array blocks (LABs) 100 are a physically-grouped set of logical resources configured or programmed to perform logical functions desired by the user. LABs 100 are comprised of a varying number of logic elements (LEs) 110, which are basic building blocks of a PLD. FIG. 1 further includes horizontal interconnects 102 and vertical interconnects 108 for routing signals inside the FPGA. Although shown as single lines, each of the horizontal and vertical interconnects 102 and 108 may represent a plurality of signal conductors. LABs 100 may have inputs and outputs (not shown), which may or may not be programmably connected to horizontal and vertical interconnects 102 and 108, respectively. LEs 110 may also be programmably connected to horizontal and vertical interconnects 102 and 108, respectively, via local interconnects 112. Control blocks 106 of the FPGA generate the programming addresses. One skilled in the art should understand and appreciate that the number of control blocks 106 in a FPGA can vary.

The FPGA in FIG. 1 is also shown to include embedded-memory array blocks 115. Each of the memory blocks 114, within the embedded-memory array blocks 115, may be a RAM of different size. In addition, each of the mentioned memory blocks 114 may also include its own control logic and circuits. The memory described above may be used to store data for use in performing logic functions. The memory blocks 114 may also be different types of memories such as read only memory (ROM), random access memory (RAM), first in first out (FIFO), etc. It should be appreciated that the functional blocks included in the FPGA of FIG. 1 are exemplary and the FPGA may include other common functional blocks, such as a digital signal processing block. The memory blocks 114 may be dual port or single port memories.

Figure 2:
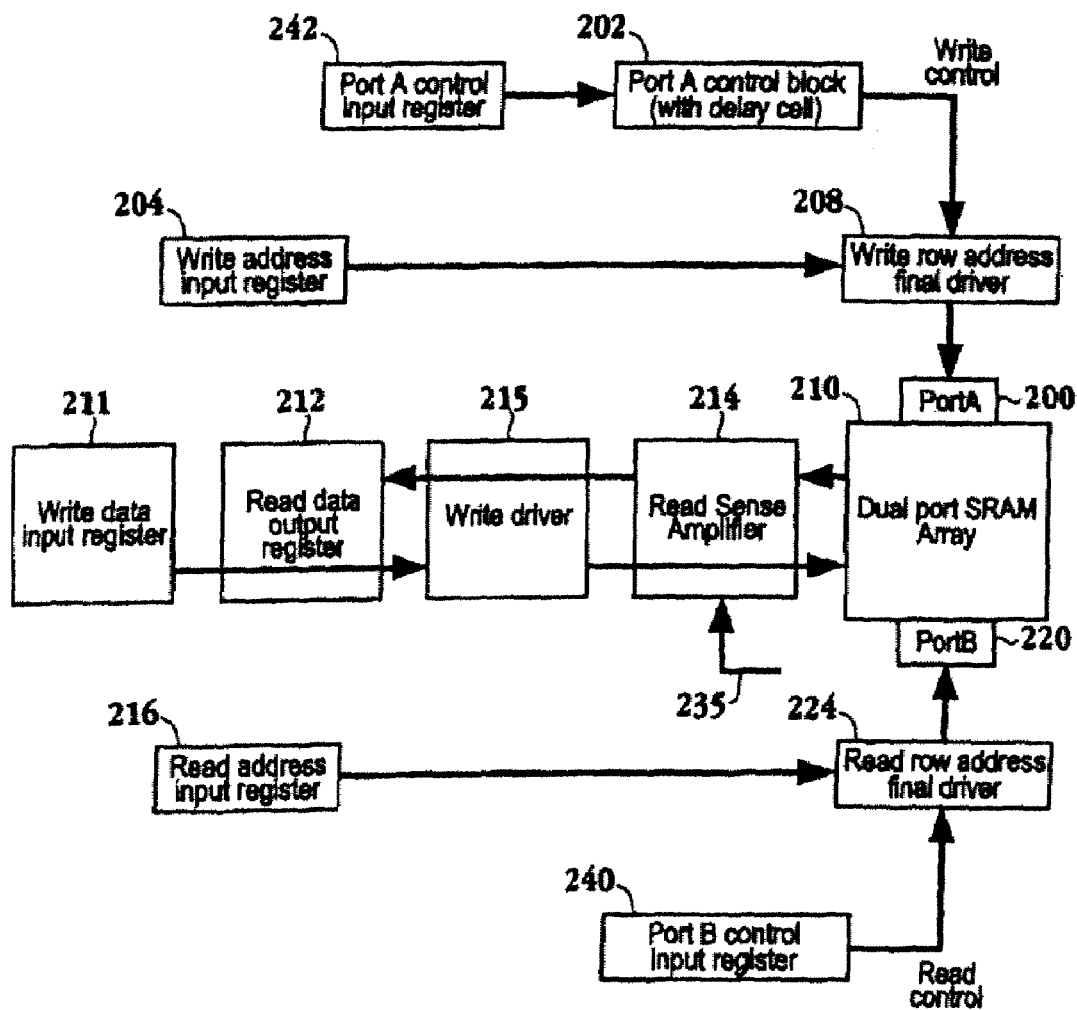
FIG. 2 shows a block diagram of an exemplary dual port RAM.

In accordance with the principles of the present invention, FIG. 2 shows a block diagram of an exemplary dual port RAM having a dual port SRAM array 210. The dual port SRAM array 210 is shown to include two ports 200 and 220. Port A 200 supports the write operation while port B 220 supports the read operation. When a read request is received, port B control input register 240 sends a read control signal to activate port B 220 through read row address final driver 224. The activation of Port B 220 causes the data to be read from a corresponding address in the SRAM array 210. FIG. 2 further illustrates read address input registers 216 and write address input register 204 each of which holds the row addresses for read operation and write operation, respectively. For a read operation, the read address within SRAM array 210, is provided by the read address input register 216 through read row address final driver 224. The data are read from the SRAM array 210 using the read sense amplifier 214. The read sense amplifier 214 is used to sense the read bitline voltage. The read sense amplifier 214 takes the read bit line value, the compliment of the read bitline value and the sense amplifier enable signal 235 as the inputs. These values are used to trigger the transfer of data from the SRAM array 210 to the read data output register 212. Similarly, when a write request is received, port A control input register 242 sends a write control signal to activate port A 200. The activation of port A 200 causes the data stored in the write data input register 211 to be written into a corresponding address of the SRAM array 210, through write driver 215.

Port A control block 202 is provided with a delay cell. The delay cell will automatically delay the write operation by a predetermined period so that when simultaneous read and write operations to the same address in the SRAM array 210 occur, the write operation will start only after the read operation. Here, the delay cell in port A control block 202 applies a worst case delay to all write operations.

Figure 3:
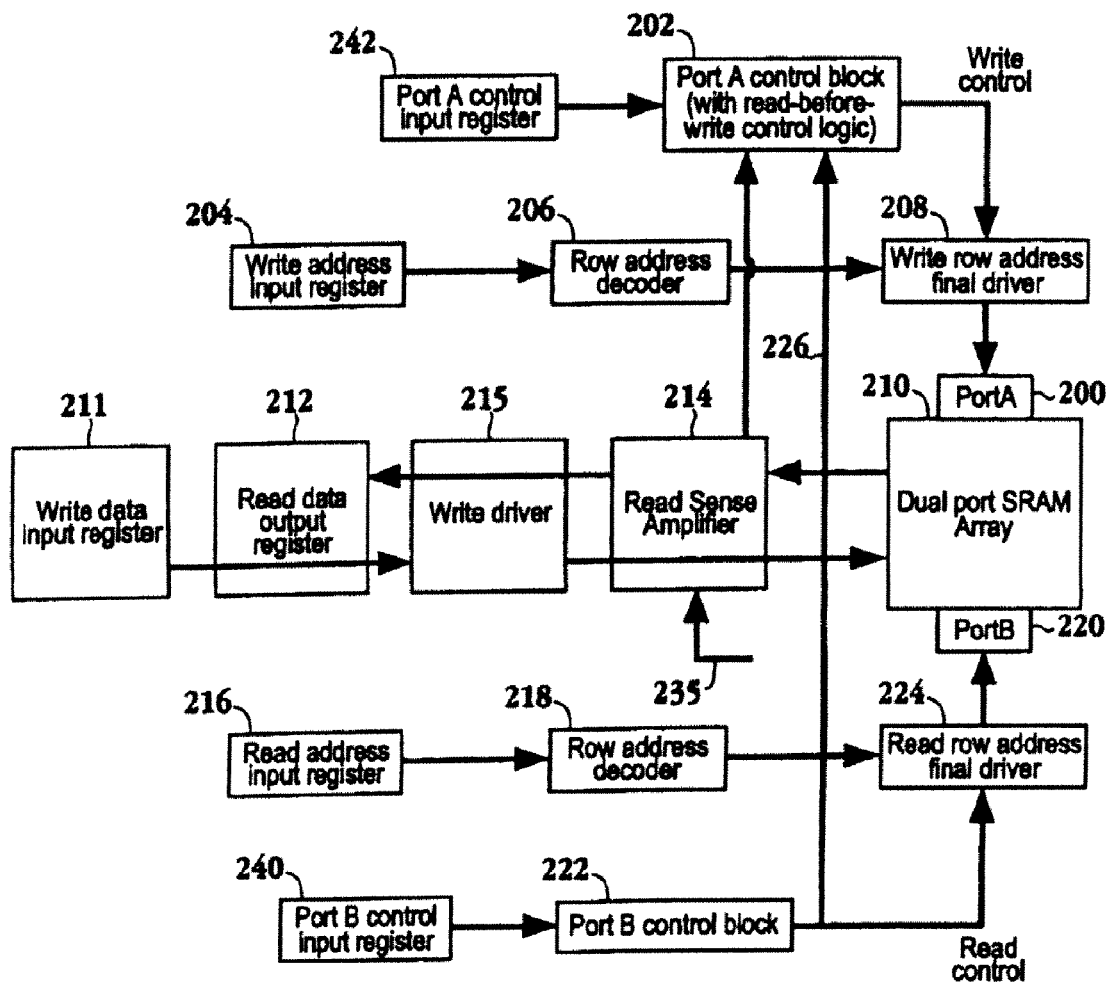
FIG. 3 shows a block diagram of an exemplary dual port RAM that utilizes a read wordline signal and a read-before-write control logic to facilitate a read operation to occur before a write operation to a RAM of a PLD in accordance with an embodiment of the invention.

FIG. 3 shows a block diagram of an exemplary dual port SRAM, utilizing the read wordline signal and a read-before-write control logic to ensure that the write operation happens after the read operation. It should be appreciated that, some blocks common to FIGS. 2 and 3 are not repeated with the discussion of FIG. 3 for the sake of brevity. Port B control block 222 generates a control signal 226 to signal the end of a read operation. In one embodiment, the control signal 226 is generated at a falling edge of the read wordline signal as explained further with reference to FIG. 4. The falling edge of the read wordline signal indicates the completion of the read operation. One skilled in the art should understand and appreciate that the control signal 226 may be generated at the rising edge, or the falling edge of the read wordline signal. In one embodiment, the port A control block 202 is provided with a read-before-write control logic to indicate that the PLD supports a read-before-write feature. The read-before-write control logic controls the write wordline signal. It should be appreciated that in some instances, the user may not require the read-before-write feature. In the present example, at the falling edge of a read wordline signal, the control signal 226 is triggered and sent to the port A control block 202. Once the control signal 226 is received, the write wordline signal is enabled through the read-before-write control logic, thereby initiating the write operation. Thus, the data are written into an address in the SRAM array 210 as described above. As can be seen, this ensures that the write operation occurs only after the read operation is complete. In one embodiment, the write and read addresses within write address input register 204 and read address input register 216, respectively, may be encoded. Therefore, the output of the write address input register 204 and read address input register 216 are fed to row address decoders 206 and 218, respectively. The row address decoders 206 and 218 decode the encoded write and read addresses, respectively. It should be appreciated that the size of the decoders depends on the size of the SRAM array 210.

Figure 4:
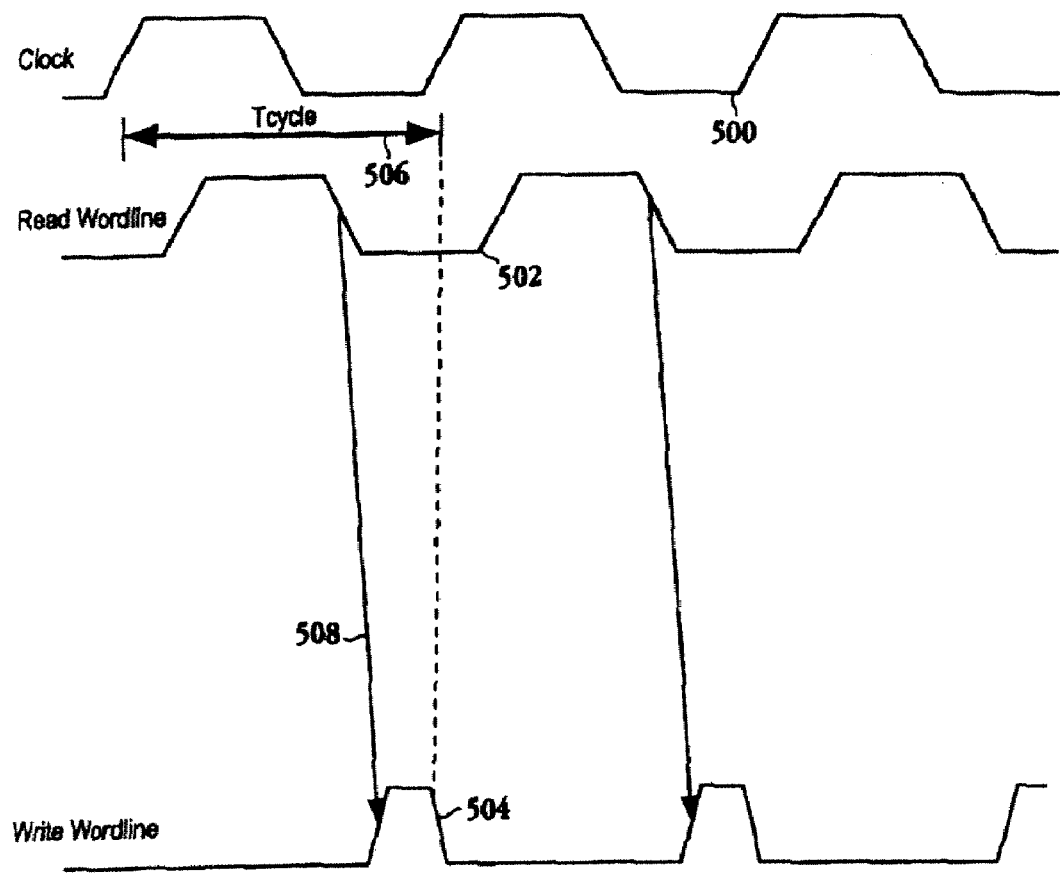
FIG. 4 is a waveform illustrating the relationship between various signals for a read-before-write operation, triggered by a read wordline cycle edge, in accordance with an embodiment of the present invention.

FIG. 4 shows waveforms illustrating the relationship between various signals for a read-before-write operation, triggered by a control signal 226 of FIG. 3, in accordance with an embodiment of the present invention. FIG. 4 includes waveforms for clock cycle 500, read wordline cycle 502, and write wordline cycle 504. One period of the clock cycle 500 is illustrated by line 506. As described above with reference to FIG. 3, the write wordline cycle 504 is started at the falling edge of the read wordline cycle 502 as illustrated by line 508. That is, at the falling edge of read wordline cycle 502, the control signal 226 of FIG. 3 is triggered to subsequently trigger the write wordline cycle 504. By having the write wordline cycle 504 start immediately after the completion of the read wordline cycle 502, the read and write operations are completed within one period of the clock cycle 500.

Figure 5:
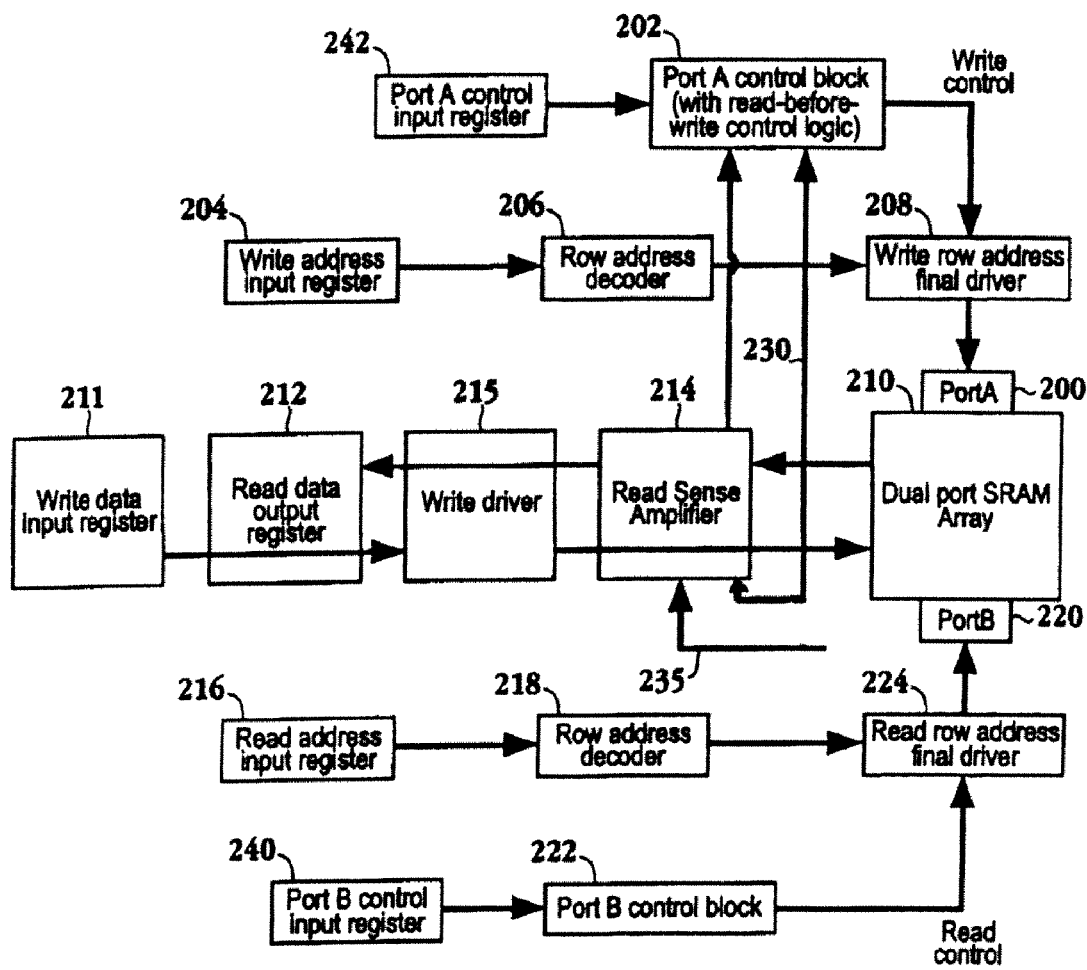
FIG. 5 illustrates a block diagram of an exemplary dual port RAM that utilizes a sense amplifier enable signal and a read-before-write control logic to facilitate a read operation to occur before a write operation to a RAM of a PLD, in accordance with an embodiment of the invention.

FIG. 5 illustrates a block diagram of an exemplary dual port SRAM, utilizing a sense amplifier enable signal and a read-before-write control logic in the port A control block 202, to ensure that the write operation happens after the read operation, in accordance with an embodiment of the present invention. It should be appreciated that the discussion of some blocks common to FIGS. 2, 3 and 5 are not repeated in FIG. 5 for the sake of brevity. As illustrated in FIG. 5, read sense amplifier 214 is capable of identifying when the data is read out of the dual port SRAM array 210. In addition, read sense amplifier 214 triggers a read sense amplifier enable signal 230 to port A control block 202 to start the write operation to an address in the SRAM array 210, according to the row address received from the row address decoder 206. In one embodiment, the read sense amplifier 214 detects a drop in voltage of a read bitline, which signifies the read operation completion. As a result of the drop in voltage, the read sense amplifier 214 signals the write operation to start immediately after the read operation by generating read sense amplifier signal 230. In another embodiment, the read sense amplifier 214 may be used to amplify the voltage difference in a bitline of the SRAM array 210 as the data are being read out, so that even minor voltage fluctuations caused by the read operation are amplified for easier detection of the voltage drop. When port A control block 202 receives the read sense amplifier signal 230, the write wordline signal is enabled and the data held in the write data input register 211 are written into the address in the SRAM array 210 through write driver 215. Further, the address in the SRAM array 210 to which the data to be written is provided by the row address decoder 206, using write row address final driver 208.

Figure 6:
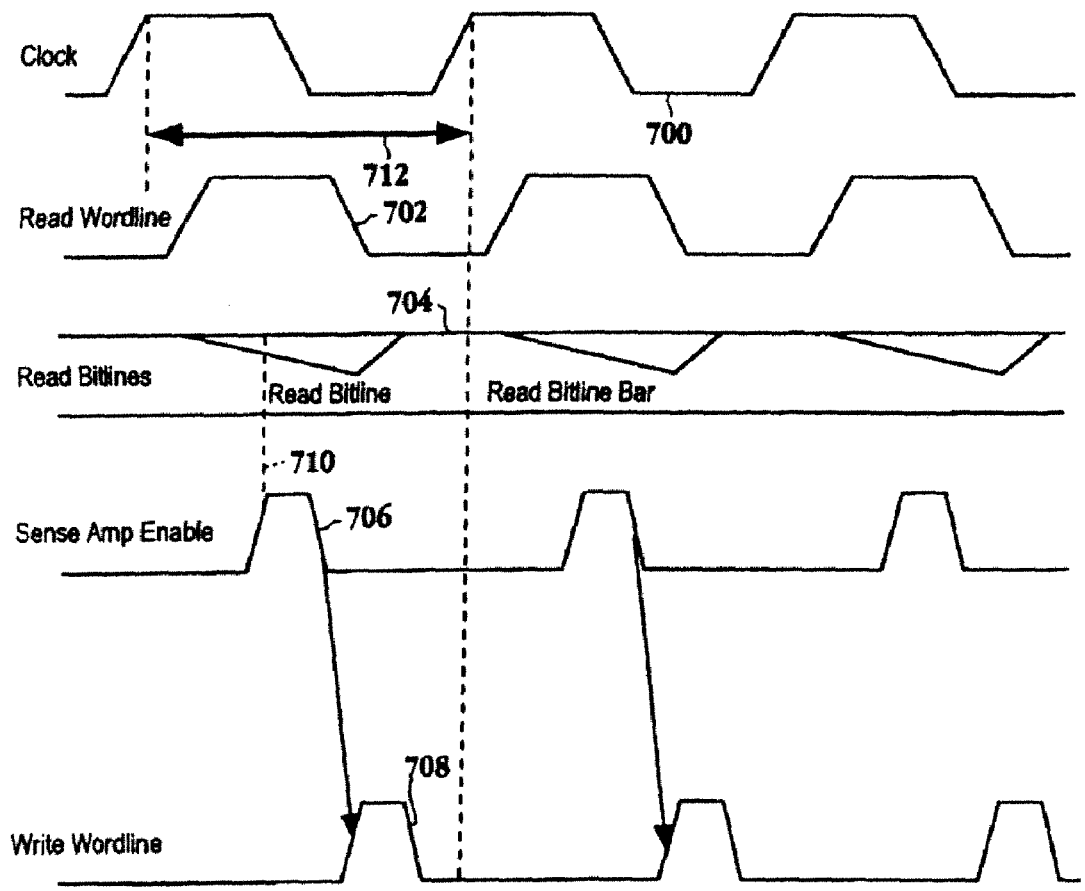
FIG. 6 is a waveform illustrating the relationship between various signals for a read-before-write operation, triggered by a sense amplifier enable signal, in accordance with an embodiment of the invention.

FIG. 6 illustrates waveforms demonstrating the relationships between various signals for a read-before-write operation triggered by a sense amplifier enable signal, in accordance with an embodiment of the present invention. FIG. 6 includes waveforms for clock waveform 700, read wordline cycle 702, read bitline cycle 704, sense amplifier enable cycle 706, and write wordline cycle 708. As the read wordline is initiated through port B 220 of FIG. 5, the read bitline voltage begins to decrease. The drop in the read bitline voltage is illustrated on read bitline cycle 704. A read sense amplifier is designed to monitor this difference in the bitline voltage, as discussed with reference to FIG. 5. In one embodiment, when the bitline voltage difference between the initial voltage and the actual voltage reaches a predetermined percentage of the initial voltage, the sense amplifier enable cycle 706 is initiated as shown by line 710. In one embodiment, the sense amplifier enable signal is triggered when the actual voltage on the read bitline is about 20% less than the initial voltage of the read bitline. At the falling edge of the sense amplifier enable cycle 706, the write wordline cycle 708 is started. It should be appreciated that the falling edge of the sense amplifier enable cycle 706 implies the completion of the read operation. As can be seen, the read and write operations are completed within one clock cycle as indicated by line 712.

Figure 7:
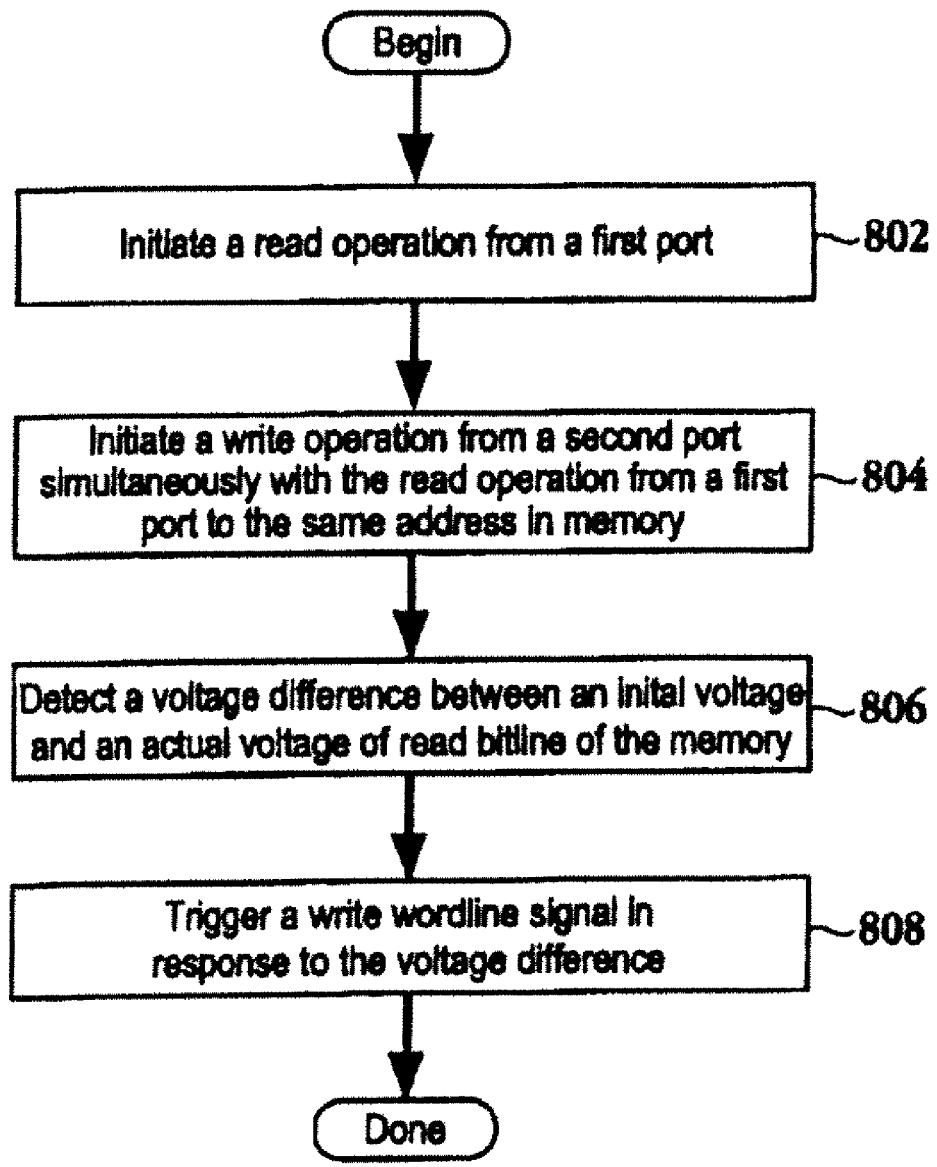
FIG. 7 is a flow chart illustrating the method of operations involved in implementing a read-before-write to a memory array within an embedded memory block in a PLD, in accordance with an embodiment of the present invention.

FIG. 7 is a flow chart illustrating the method of operations involved in implementing read-before-write operations from and to a memory array within an embedded memory block in a PLD, in accordance with an embodiment of the present invention. The method begins with operation 802, where a read operation is initiated through a first port from a particular address in the memory of the PLD. Simultaneously, a write operation is initiated, through a second port, to the same address in the memory of the PLD in operation 804. As described above, if the write operation completes first, then the data to be read will be erased. Therefore, it is necessary that the read operation be completed prior to the write. As such, in operation 806 the method provides for detecting the voltage difference between the initial voltage and the actual voltage of the read bitline of the memory of the PLD. In one embodiment, when the voltage difference is equal to a predetermined percentage of the initial voltage, a write wordline signal is triggered as indicated in operation 808. The read bitline voltage difference being equal to a predetermined percentage of the initial voltage, is an indication that the read operation is complete or nearly complete and the write operation may begin. Thus, a read sense amplifier enable signal is triggered in response to the voltage difference, and in turn the write wordline signal is generated. As described above in detail with reference to FIG. 5, a read sense amplifier monitors the voltage difference. The data are written to the memory of a SRAM once the write control is triggered. The second port control block includes a read-before-write control logic that ensures that the write wordline signal is triggered only after a second port control block receives the read sense amplifier enable signal from the read sense amplifier. In an alternative method, to implement the read-before-write operation a read word line cycle may be monitored. At the falling edge of the read word line cycle, that indicates an end of the read operation, a control signal is generated as discussed with reference to FIG. 3.

As can be seen, the embodiments described above with respect to FIGS. 3 and 5 can accomplish read-before-write without additional delay elements. Also, the designers are not required to use programmable delay units to find the delays needed for the worst case. Avoidance of this "one size fits all" approach removes any limitation on the cycle time needed to support read-before-write operations from different ports in the same clock cycle. Additionally, the need for added testing, by the testing and production engineers is eliminated. Moreover, the speed of the device can be improved since the write operation is designed to start immediately after the read operation without any delay. Consequently, the maximum frequency the memory can support is vastly improved.

In one exemplary embodiment, the memory block occupies roughly 20% of the PLD core area, therefore, the savings in layout area achieved by the embodiments described herein can have a significant effect on the overall real estate space of the PLD. In addition, for a 90 nm dual port SRAM block with 128 rows and 36 columns, the maximum frequency may be improved by approximately 17.6% through the embodiments described above. In this example, if the current dual port memory block maximum frequency is 400 MHz, the new design incorporating the embodiments described herein will improve the maximum frequency to 470 MHz, i.e., an improvement of approximately 18%.

The embodiments thus far were described with respect to PLDs. The embedded memory block described herein may be incorporated into any suitable integrated circuit. For example, the embedded memory block may be incorporated into other types of programmable logic devices such as programmable array logic (PAL), programmable logic array (PLA), field programmable logic array (FPLA), electrically programmable logic devices (EPLD), electrically erasable programmable logic device (EEPLD), logic cell array (LCA), just to name a few. The programmable logic device may be a part of a data processing system that includes one or more of the following components: a processor, memory; I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for a read-before-write functionality for a memory within integrated circuit (IC), comprising:
    initiating a read wordline operation from a first port of the memory;
    initiating a write wordline operation contemporaneously with the read wordline operation from a second port of the memory;
    detecting a transition of a signal associated with the read wordline operation;
    generating a control signal in response to detecting the transition, wherein the control signal triggers a write wordline signal; and
    proceeding with the write wordline operation to the memory within the IC in response to the write wordline signal.

2. The method of claim 1, further comprising:
    pausing the write wordline operation until the control signal enabling the write wordline signal is received.

3. The method of claim 1, wherein the read wordline operation and the write wordline operation are directed from and to a same address in the memory.

4. The method of claim 1, wherein the read wordline operation occurs prior to the write wordline operation.

5. The method of claim 1, wherein the transition occurs at one of a rising edge or a falling edge of the read wordline operation.

6. The method of claim 1 wherein the triggering of the write wordline signal causes the write operation and the read operation to occur within a single clock cycle.

7. The method of claim 1 wherein the second port includes a read-before-write control logic to pause the write operation until the write enable signal is activated.

8. The method of claim 1 wherein the control signal is generated in response to a read wordline falling edge.

* * * * *